United States Patent
Chen et al.

(10) Patent No.: US 8,035,944 B2
(45) Date of Patent: Oct. 11, 2011

(54) POWER SUPPLY SYSTEM WITH ADAPTIVE BLOWN FUSE DETECTION USING NEGATIVE SEQUENCE COMPONENT

(75) Inventors: Xian Chen, Lewis Center, OH (US); Brian P. Heber, Delaware, OH (US)

(73) Assignee: Liebert Corporation, Columbus, OH (US)

( * ) Notice: Subject to any disclaimer, the term of this patent is extended or adjusted under 35 U.S.C. 154(b) by 475 days.

(21) Appl. No.: 12/371,644

(22) Filed: Feb. 16, 2009

(65) Prior Publication Data
US 2009/0213627 A1     Aug. 27, 2009

Related U.S. Application Data

(60) Provisional application No. 61/066,881, filed on Feb. 22, 2008.

(51) Int. Cl.
*H02H 5/00* (2006.01)
(52) U.S. Cl. .......................................... 361/103
(58) Field of Classification Search .................. 361/103, 361/115
See application file for complete search history.

(56) References Cited

U.S. PATENT DOCUMENTS

| | | | |
|---|---|---|---|
| 3,783,341 A * | 1/1974 | Beckwith | 361/85 |
| 3,947,728 A | 3/1976 | Smith | |
| 4,210,948 A | 7/1980 | Waltz | |
| 4,349,813 A * | 9/1982 | Ishibashi et al. | 340/638 |
| 4,745,512 A | 5/1988 | Hampson | |
| 4,835,651 A * | 5/1989 | Li et al. | 361/68 |
| 5,537,026 A * | 7/1996 | Estes et al. | 323/239 |
| 5,602,707 A | 2/1997 | Schweitzer, III et al. | |
| 5,822,165 A | 10/1998 | Moran | |
| 5,883,578 A | 3/1999 | Roberts et al. | |
| 6,654,216 B2 | 11/2003 | Horvath et al. | |
| 7,180,940 B2 | 2/2007 | Li et al. | |
| 7,299,143 B2 | 11/2007 | Price | |
| 2003/0142450 A1 | 7/2003 | Bo | |

OTHER PUBLICATIONS

An Instantaneous Phase Angle Detection Algorithm Under Unbalanced Line Voltage Condition Hong-Seok Song; Hyun-Gyu Park; Kwanghee Nam Power Electronics Specialists Conference, 1999. PESC 99. 30th Annual IEEE vol. 1, Issue, Aug. 1999 pp. 533-537.
New Robust Voltage Sag Disturbance Detector Using an Adaptive Prediction Error Filter Chung, J.; Powers, E.J.; Grady, W.M.; Bhatt, S.C. Power Engineering Society Summer Meeting, 1999. IEEE vol. 1, Issue , Jul. 18-22, 1999 pp. 512-517 vol. 1 Digital Object Identifier 10.1109/PESS.1999.784403.
International Search Report and Written Opinion of the International Searching Authority (PCT/US2009/034351).

* cited by examiner

*Primary Examiner* — Stephen W Jackson
(74) *Attorney, Agent, or Firm* — Harness, Dickey & Pierce, P.L.C.

(57) ABSTRACT

Existing measurements of an input component (such as voltage or current) in a three phase power supply system are decomposed into a negative sequence component. The negative sequence component, which is significantly higher when a rectifier fuse is blown, is compared to a threshold and a determination made that a rectifier fuse is blown when the negative component exceeds the threshold. In an aspect, an adaptive algorithm is used to make the detection work better in the range of the nominal frequency of the input voltage. In an aspect, the negative sequence is determined indirectly from the existing measurements.

25 Claims, 11 Drawing Sheets

US 8,035,944 B2

POWER SUPPLY SYSTEM WITH ADAPTIVE BLOWN FUSE DETECTION USING NEGATIVE SEQUENCE COMPONENT

This application claims the benefit of U.S. Provisional Application No. 61/066,881 filed on Feb. 22, 2008. The entire disclosure of this provisional application is incorporated herein by reference.

FIELD

The present disclosure relates to power supply systems, and more particularly, to the detection of blown input fuses in a power supply system having an AC/DC converter.

BACKGROUND

The following description is merely exemplary in nature and is not intended to limit the present disclosure, application, or uses.

In certain power supply systems, such as UPS systems, there is no direct measurement available to determine the status of rectifier fuses, whether blown or normal. In order to ensure safe, reliable and proper operation, the status of the rectifier fuses must be determined correctly and efficiently. FIG. 1 is a simplified schematic of such a prior art UPS system 100.

UPS system 100 includes an AC/DC converter 102, a DC/AC converter 104, and a DC back-up power source 106. UPS system 100 provides uninterruptible power at a load voltage (such as 480 VAC) to a load. The load may illustratively be equipment in a facility or part of a facility, such as computer systems in a data room. UPS system 100 may further include a bypass switch (not shown) which may be used to couple input power to UPS system 100 to the load bypassing the AC/DC converter 102 and the DC/AC converter 104.

UPS system 100 may illustratively be a three-phase UPS system. The input AC power is three phase AC with three legs V_ac-in_A, V_ac-in_B, V-ac-in-C of the power feed, such as from a power feed from a utility company, coupled through three poles of circuit breaker 112 to filter inductors $Lin_{1-3}$ and input fuses $F_{1-3}$ to an input 120 of AC/DC converter 102. Fuses $F_{1-3}$ may be referred to herein as "rectifier fuses" as AC/DC converter 102 is typically a rectifier, such as described below. Illustratively, the three phase input AC power is 480 VAC.

AC/DC converter 102 converts the AC power to DC that is provided to a DC bus 118 at an output 122 of AC/DC converter 102. An input 124 of a DC/AC converter 104 is coupled to DC bus 118. DC/AC converter 104 converts the DC on DC bus 118 to AC at an output 126 of UPS system 100. Back-up DC power source 106 is also coupled to DC bus 118. A filter inductor LDC may illustratively couple a negative side of output 122 of AC/DC converter 102 to a negative side of DC bus 118.

UPS system 100 includes a control module 132 that controls UPS system 100. Control module 132 has inputs 134 and outputs 136 coupled to various elements of UPS system 100, as described in more detail below. Control module 132 may illustratively be a computer, a microcontroller, a digital signal processor, or other programmable device that is programmed with software to control UPS system 100.

UPS system 100 illustratively has the following measurements available: two current transformers $CT_1$ and $CT_2$ at the output side of circuit breaker 112 on two of the three legs of the three phase AC input power, three phase input voltage measurements, such as at the poles of circuit breaker 112. Optionally, there may be a third current transformer $CT_3$ as shown in phantom FIG. 1 In this regard, the current transformers and other sensors are coupled to respective inputs 134 of control module 132. But UPS system 100 does not have any existing measurements of the voltage differences across the fuses $F_1$, $F_2$ and $F_3$ from which the status of these fuses can be directly determined.

AC/DC converter 102 and DC/AC converter 104 illustratively include switched semiconductor devices as described in more detail below. These devices have gate inputs coupled to respective outputs 136 of control module 132. Control module 132 gates the switched devices of AC/DC converter 102 and DC/AC converter 104 in known fashion to control UPS system 100.

FIG. 2 is a simplified schematic showing AC/DC converter 102 and DC/AC converter 104 in more detail. AC/DC converter 102 may illustratively be a rectifier and illustratively include three complementary pairs of switched semiconductor devices 200, one pair for each phase, that provide rectification. Respective junctions $208_{1-3}$ of the complementary pairs provide power inputs for each of the three phases, thus providing AC/DC converter 102 with a three phase power input 209. Each of rectifier fuses $F_{1-3}$ is coupled to a respective one of the junctions $208_{1-3}$. Switched semiconductor devices 200 may be silicon controlled rectifiers, MOSFETs, thyristors, IGBTs, or other switched semiconductor devices that provide rectification. Gates 202 (only two of which are identified by reference number 202 in FIG. 2) of switched semiconductor devices 200 are coupled to outputs 136 of control module 132.

DC/AC converter 104 may illustratively be an inverter and where UPS system 100 has a three phase output, include three complementary pairs of switched semiconductor devices 204, one pair for each phase. Switched semiconductor devices 204 may illustrative be IGBTs, MOSFETS, SCRs, thyristors, or other switched semiconductor devices. Gates 206 (only two of which are identified by reference number 206 in FIG. 2) of switched semiconductor devices 204 are coupled to outputs 136 of control module 132.

It should be understood that the power supply system can be other than a UPS system. For example, the power supply system can be a power conditioning system 900 having AC/DC converter 102, DC/AC converter 104, but without back-up DC power source 106 as shown in FIG. 9. Alternatively, power supply system 1000 may have the DC bus 118 coupled to a DC/DC converter 1002 as shown in FIG. 10. In an aspect, power supply system 1000 can be an uninterruptible power supply system, in which case it would have a back-up DC power source, such as back-up DC power source 106 (shown in phantom in FIG. 10), coupled to DC bus 118. Alternatively, power supply system 1100 may have DC bus 118 coupled directly to output 1102 of power supply system 1100, so that DC bus 118 is coupled directly to a DC load 1104, as shown in FIG. 11.

SUMMARY

In accordance with an aspect of the present disclosure, a power supply system and method of operating the power supply system to determine if any of input fuses are blown is provided. The power supply system has an AC/DC converter having a three phase power input coupled through three fuses to three legs of three phase AC power, an output coupled to a DC bus, and a control input coupled to an output of a control module. The three phase input power has input components including current and voltage. The control module generates three arrays of data for one of the input components, one array for each of the three phases of the three phase input power including a Phase A sample data array for a Phase A component of the input component, a Phase B sample data array for a Phase B component of the input component, and a Phase C sample data array for a Phase C component of the input component. The control module generates the negative sequence of the input component by taking one third of the sum of point $I_a$, point $I_b$ which is 240 degree delay from point $I_a$ and point $I_c$ which is 120 degree delay from point $I_a$. Point, $I_a$ is a datum in the Phase A data array when the negative sequence is being determined. 240 degree delay from point $I_a$ means the datum point in the line cycle that is 240 degrees delayed from the point $I_a$, and 120 degree delay from point $I_a$ means the datum point in the line cycle that is 120 degrees delayed from the point $I_a$. The control module determines that an input fuse is blown if the value of the negative sequence of the input component exceeds a threshold.

In an aspect, the input component for which the control module generates the negative sequence is input voltage.

In an aspect, the input component for which the control module determines the negative sequence is input current.

In an aspect, the control module generates the absolute value of the negative sequence of the input component, filters the absolute value of the negative sequence of the input component to generate an RMS value of the negative sequence of the input component, and determines that the value of the negative sequence of the input component exceeds the threshold determines if the RMS value of the negative sequence of the input component exceeds the threshold.

In an aspect, the control module control module samples one or more of the of the Phase A, Phase B and Phase C input components to generate the Phase A, Phase B and Phase C sample data arrays. The control module samples those of the Phase A, Phase B and Phase C input components that it samples at a fixed sampling rate, measures an actual frequency of a line voltage of the input power and adjusts when it begins storing samples of the Phase B and Phase C input components in the Phase B and Phase C sample data arrays based on any deviation of the actual frequency from a nominal frequency of the line voltage.

In an aspect, if the samples of the Phase A, Phase B and Phase C input components are not 120 degrees apart from each other due to a deviation of the actual frequency from nominal frequency, the control module adjusts the samples for the Phase B and Phase C data sample arrays using linear interpolation so that the samples stored in the Phase A, Phase B and Phase C data samples are 120 degrees apart from each other.

In an aspect where the input component is input current, the UPS system has current transformers on only two of the three legs of the three phase input power. The current transformers are coupled to inputs of the control module. The control module samples via the first and second current transformers input current on the two legs having the first and second current transformers and generates the array of Phase A sample data for one cycle of the input current on the leg having the first current transformer and the array of Phase B sample data for one cycle of the input current on the leg having the second current transformer. The control module generates the array of Phase C sample data for input current on the leg not having either the first or second current transformers from the Phase A sample data and Phase B sample data by determining each sample for the Phase C sample data array by the equation $i_a+i_b+i_c=0$ where for each sample point in the line cycle $i_a$ is a sample of the Phase A current taken at that sampling point and $i_b$ is a sample in the Phase B current taken at that sampling point.

In an aspect, the control module includes a digital signal processor that is used to generate the negative sequence.

In an aspect, the power supply system is a UPS system having a DC/AC converter having a power input coupled to the DC bus, a power output coupled to a power output of the UPS system and a control input coupled to an output of the control module. It also includes a back-up DC power source coupled to the DC bus.

In an aspect, the power supply system is a power conditioning system having a DC/AC converter having a power input coupled to the DC bus, a power output coupled to a power output of the UPS system and a control input coupled to an output of the control module.

In an aspect, the power supply system has a DC/DC converter having a power input coupled to the DC bus, a power output coupled to a power output of the power supply system and a control input coupled to an output of the control module. In an aspect, this power supply system is an uninterruptible power supply system having a back-up DC power source is coupled to the DC bus.

In an aspect, the DC bus is coupled to an output of the power supply system.

DRAWINGS

The drawings described herein are for illustrative purposes only of selected embodiments and not all possible implementations, and are not intended to limit the scope of the present disclosure.

Figure 4:
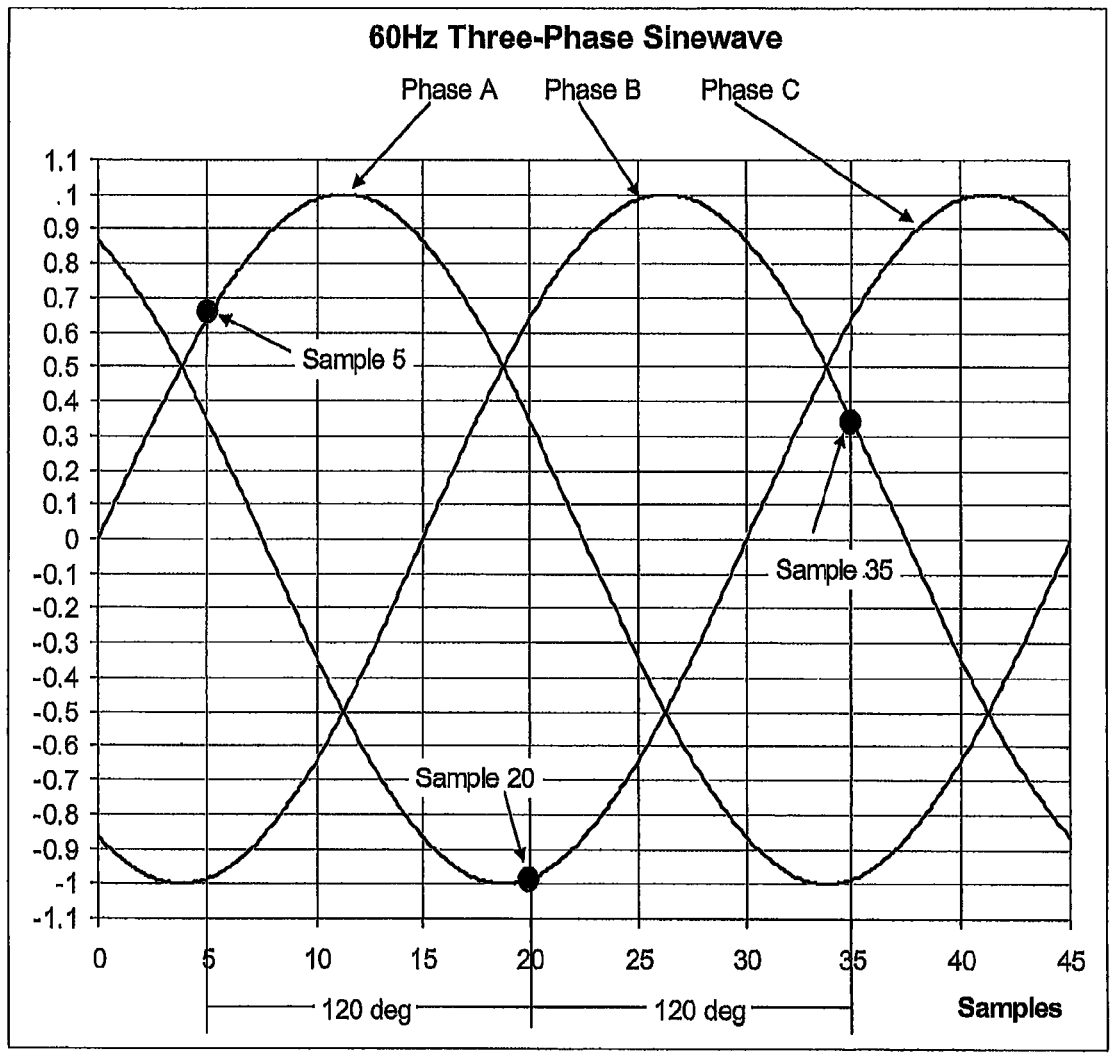
Figure 5:
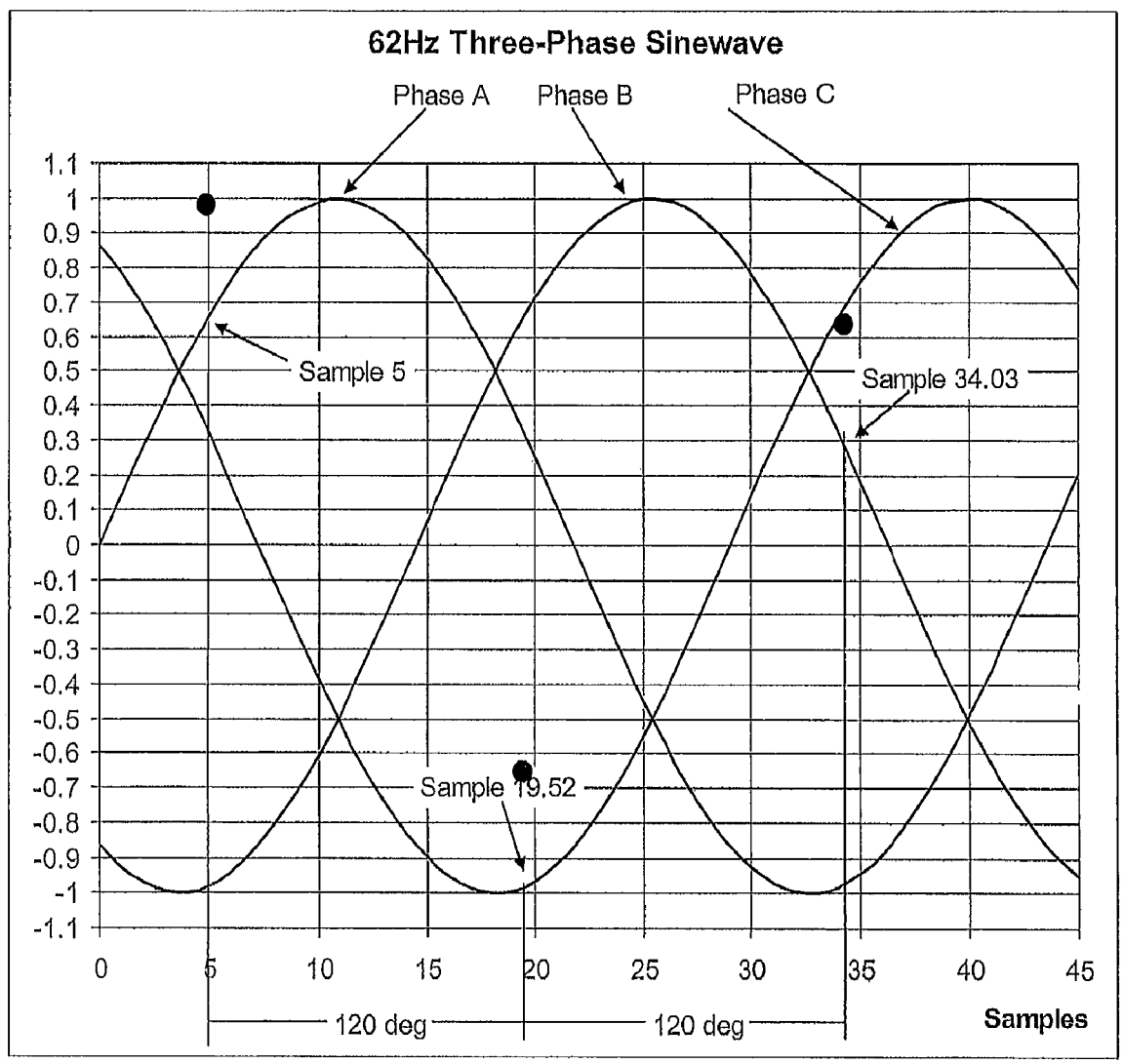
Figure 6:
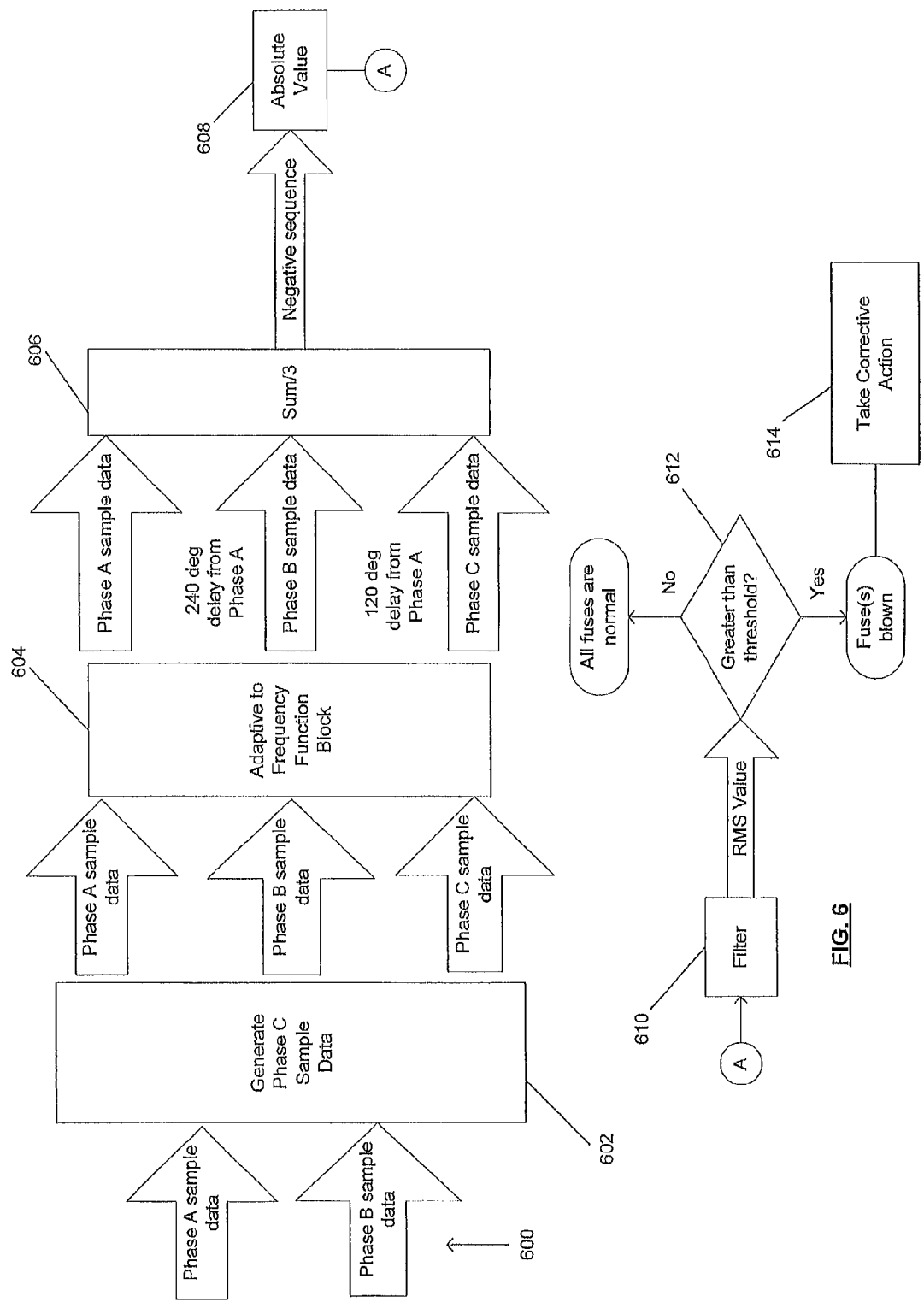
Figure 7:
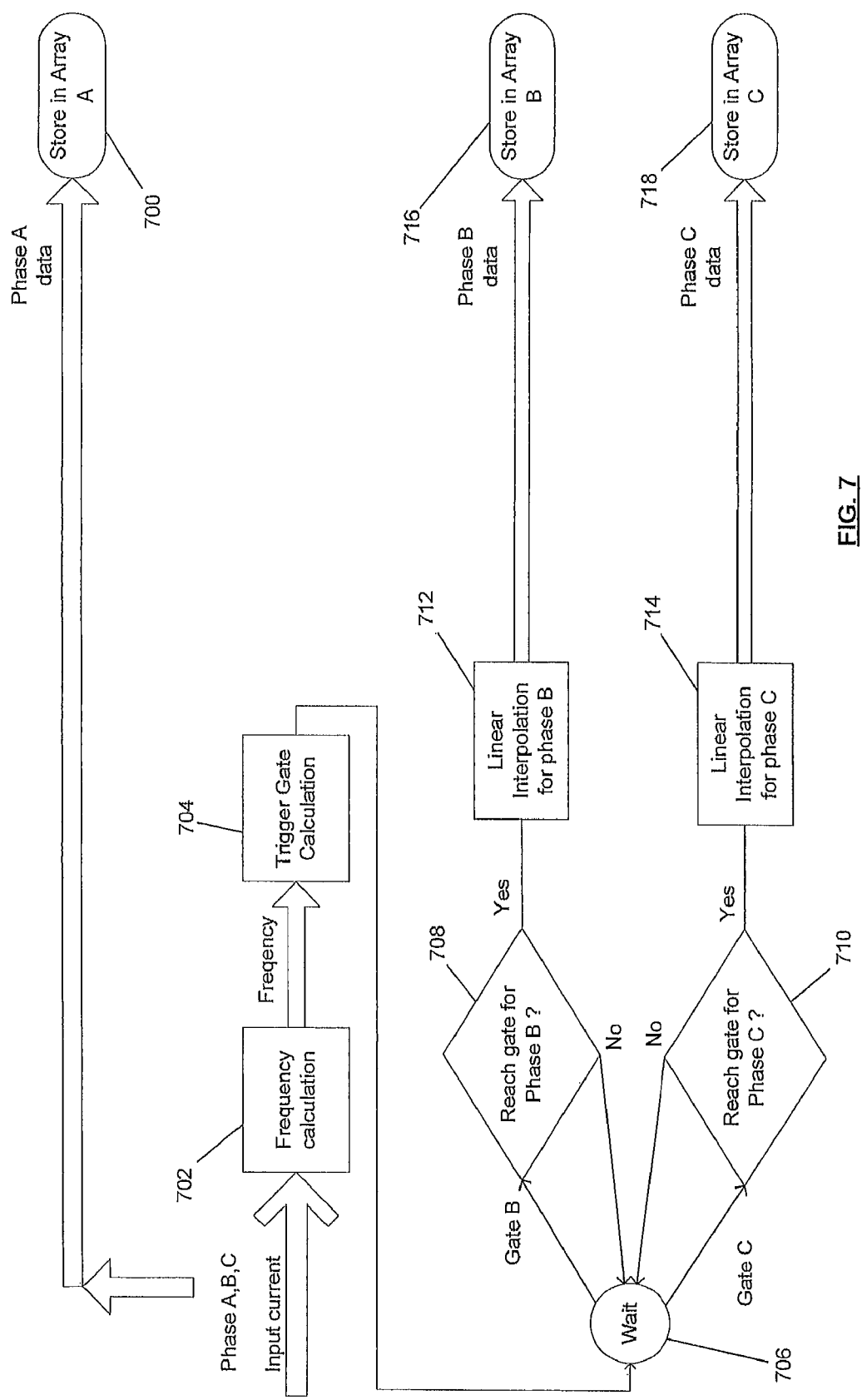
Figure 8:
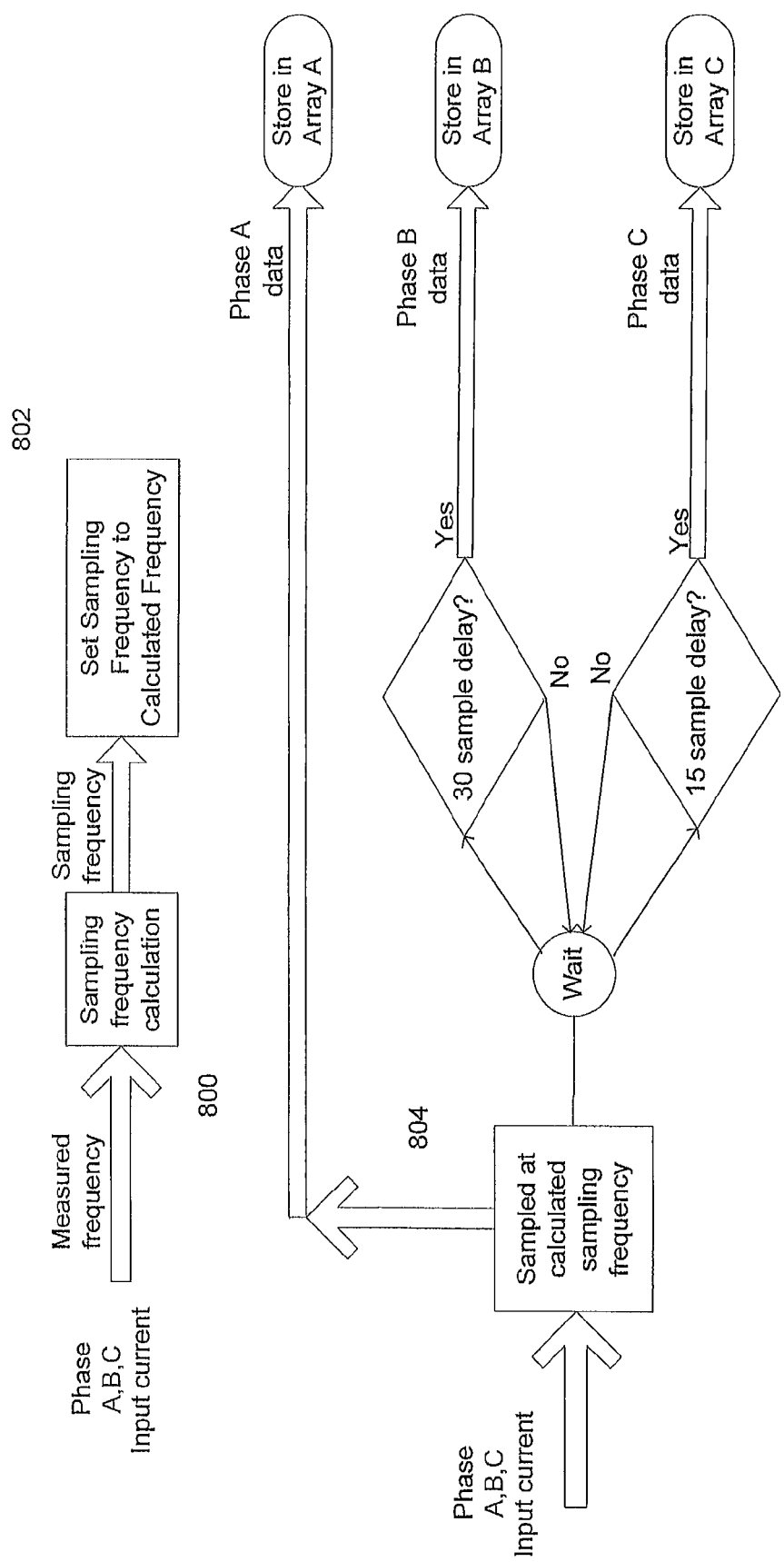
Figure 9:
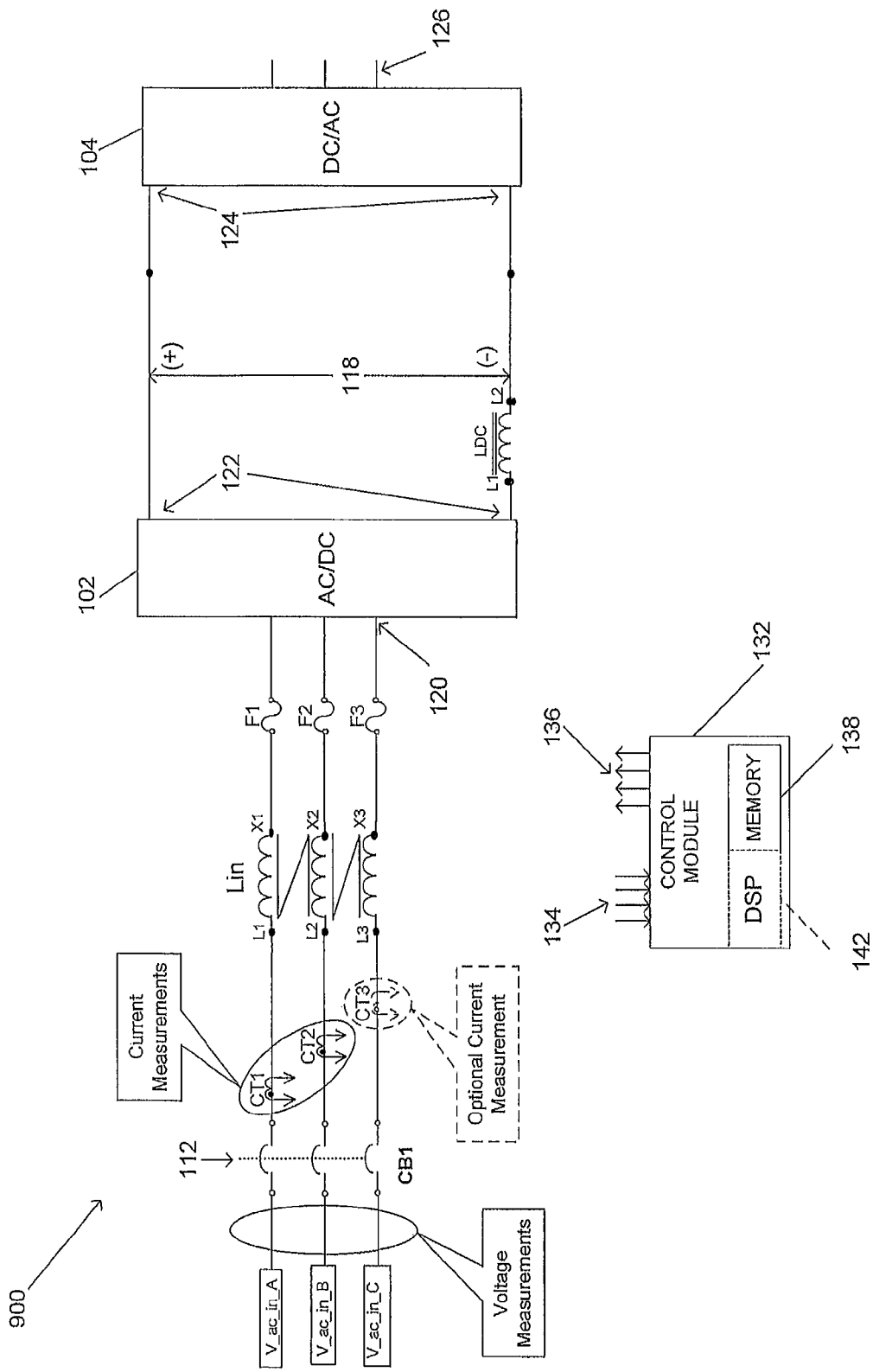
Figure 10:
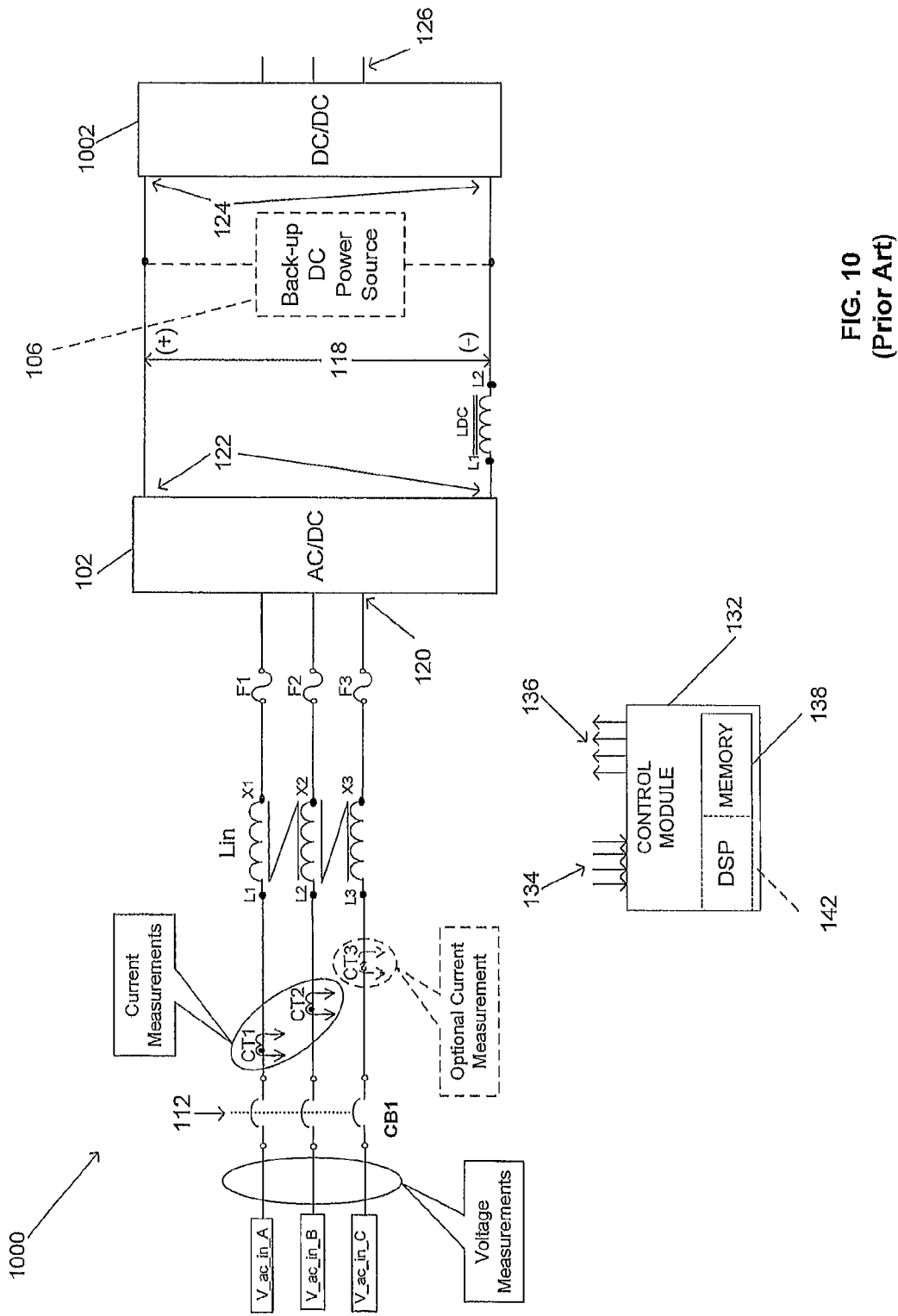
Figure 11:
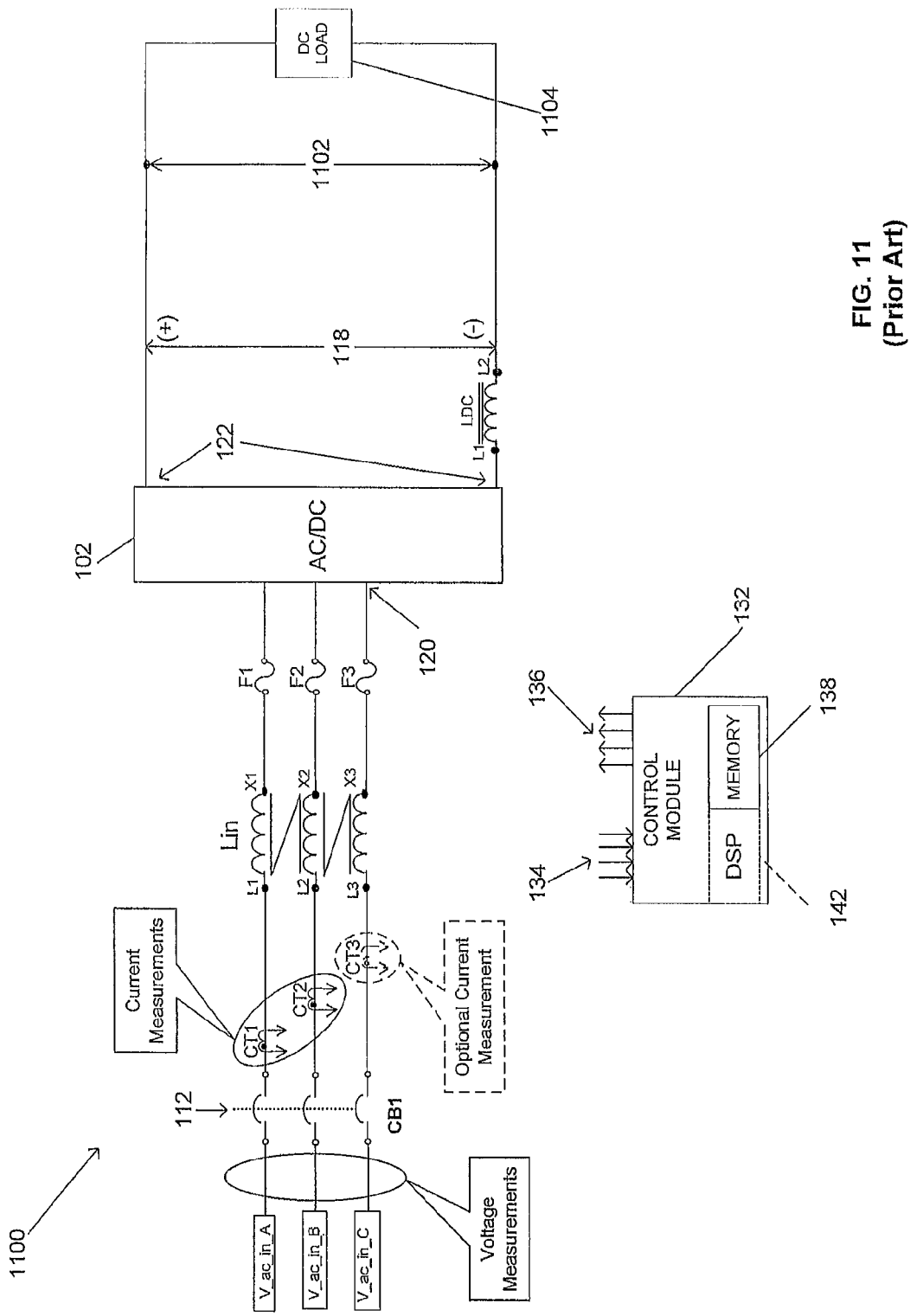

FIG. 4 is a graph showing the sampled data points for a frequency of 60 Hz when sampled every 8 electrical degrees in other words 45 samples per one electrical cycle or sampled every 0.000370370 seconds;

FIG. 5 is a graph showing the sampled data points for a frequency of 62 Hz when sampled the same rate as in FIG. 4;

FIG. 6 is a flow chart of an adaptive blown fuse detection methodology in accordance with an aspect of the present disclosure;

FIG. 7 is a flow chart of an adaptive to frequency methodology in accordance with an aspect of the present disclosure;

FIG. 8 is a flow chart of an alternative adaptive frequency methodology in accordance with an aspect of the present disclosure;

FIG. 9 is a simplified schematic of a prior art power supply system that is a power conditioning system;

FIG. 10 is a simplified schematic of a prior art power supply system having a DC/DC converter; and FIG. 11 is a simplified schematic of a prior art power supply system having DC output provided by a DC bus.

Corresponding reference numerals indicate corresponding parts throughout the several views of the drawings.

DETAILED DESCRIPTION

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

In accordance with an aspect of the present disclosure, existing measurements of a power supply system, such as UPS system 100 (FIG. 1), power conditioning system 900 (FIG. 9), power supply system having a DC/DC converter (FIG. 10), or power supply system 1100 (FIG. 11) where the output is provided by the DC bus, are decomposed into a negative sequence component. The negative sequence component, which is significantly higher when a rectifier fuse is blown, is compared to a threshold and a determination made that a rectifier fuse is blown when the negative component exceeds the threshold. In an aspect, an adaptive algorithm is used to make the detection work better in the range of the nominal frequency of the input voltage. Accordingly, a blown rectifier fuse can be reliably and efficiently detected without any additional measurements. Further, this blown fuse detection methodology is adaptive to a wide range of frequencies, input voltage and KVA.

Instead of using direct traditional measurements as is typically done, the blown fuse detection methodology in accordance with an aspect of the present disclosure uses the negative sequence determination from indirect existing measurements to determine the status of rectifier fuses. It does the same function as the direct measurements without any additional costs. Also, an adaptive algorithm is used to make the detection work correctly in the range of ±20 Hz of the nominal frequency of the UPS input voltage, which is far beyond the typical frequency range of the nominal frequency of the UPS input voltage, and works efficiently as well. The typical frequency range of the nominal frequency of the UPS input voltage is on the order of ±10 Hz.

In accordance with an aspect of the present disclosure, the two available current transformers CT1 and CT2 are used to get a negative sequence of input current which is used to determine the status of the rectifier fuses.

In a three-phase system, such as UPS system 100, there are three symmetrical components: positive sequence, negative sequence, and zero sequence. The symmetrical components may be three voltage sequences or three current sequences. The positive sequence component consists of the balanced three-phase components, which are always equal in magnitude and phase displaced by 120 degrees rotating at the system frequency with a phase sequence of A, B, C. The sequence currents or sequence voltages always exist in all three phases, never alone or in pairs. The negative sequence component is also balanced with three equal magnitude quantities at 120 degrees apart but with the phase rotation or sequence reversed, or A, C, B. (If the positive sequence is A, C, B as in some power systems, then negative sequence will be A, B, C.) Also, for the negative sequence set, the sequence currents or sequence voltages always exist in all three phases, never alone or in pairs. As to the zero sequence, components of rotating phasors are always equal in magnitude and always in phase. If zero sequence currents or zero sequence voltages exist, they must exist in all three phases, never alone or in one phase.

In a balanced system, only the positive sequence component exists. Both negative and zero sequence components are zero. However, during unbalanced conditions such as those caused by faults between phases and/or ground faults, open phases and unbalanced impedances, etc, the negative sequence and zero sequence components are no longer zero. A blown rectifier fuse of a UPS is one kind of unbalanced condition. Thus, the negative sequence of the input three-phase current of the UPS is used to determine the status of the rectifier fuses. That is, whether the rectifier fuses are blown or not.

There are several methods to get a negative sequence, such as Fourier Transform, using PLL and Park Transform. But they are either too complicated to implement in a digital signal processor ("DSP") or require too many software resources. Compared with those traditional methods, the algorithm used in accordance with an aspect of the present disclosure is easy to achieve and simple to implement in a DSP.

Since UPS system 100 has only two CTs ($CT_1$ and $CT_2$) measuring the input current on two of three legs of input power, and no ground route, assume for each sampling point in the line cycle that $i_a + i_b + i_c = 0$ in order to get $i_c$. The formula to derive three symmetrical components is:

$$\begin{bmatrix} \dot{i}_{a0} \\ \dot{i}_{a1} \\ \dot{i}_{a2} \end{bmatrix} = \frac{1}{3} * \begin{bmatrix} 1 & 1 & 1 \\ 1 & \alpha & \alpha^2 \\ 1 & \alpha^2 & \alpha \end{bmatrix} * \begin{bmatrix} \dot{i}_a \\ \dot{i}_b \\ \dot{i}_c \end{bmatrix}$$

Where $$\alpha = e^{j120°} = -\frac{1}{2} + j\frac{\sqrt{3}}{2},$$

$I_{a0}{}^{\bullet}$, $I_{a1}{}^{\bullet}$ and $I_{a2}{}^{\bullet}$ represent the zero sequence, positive sequence and negative sequence, respectively.

So, $$\dot{i}_{a2} = \frac{1}{3}(\dot{i}_a + e^{j240°} * \dot{i}_b + e^{j120°} * \dot{i}_c).$$

Figure 3:
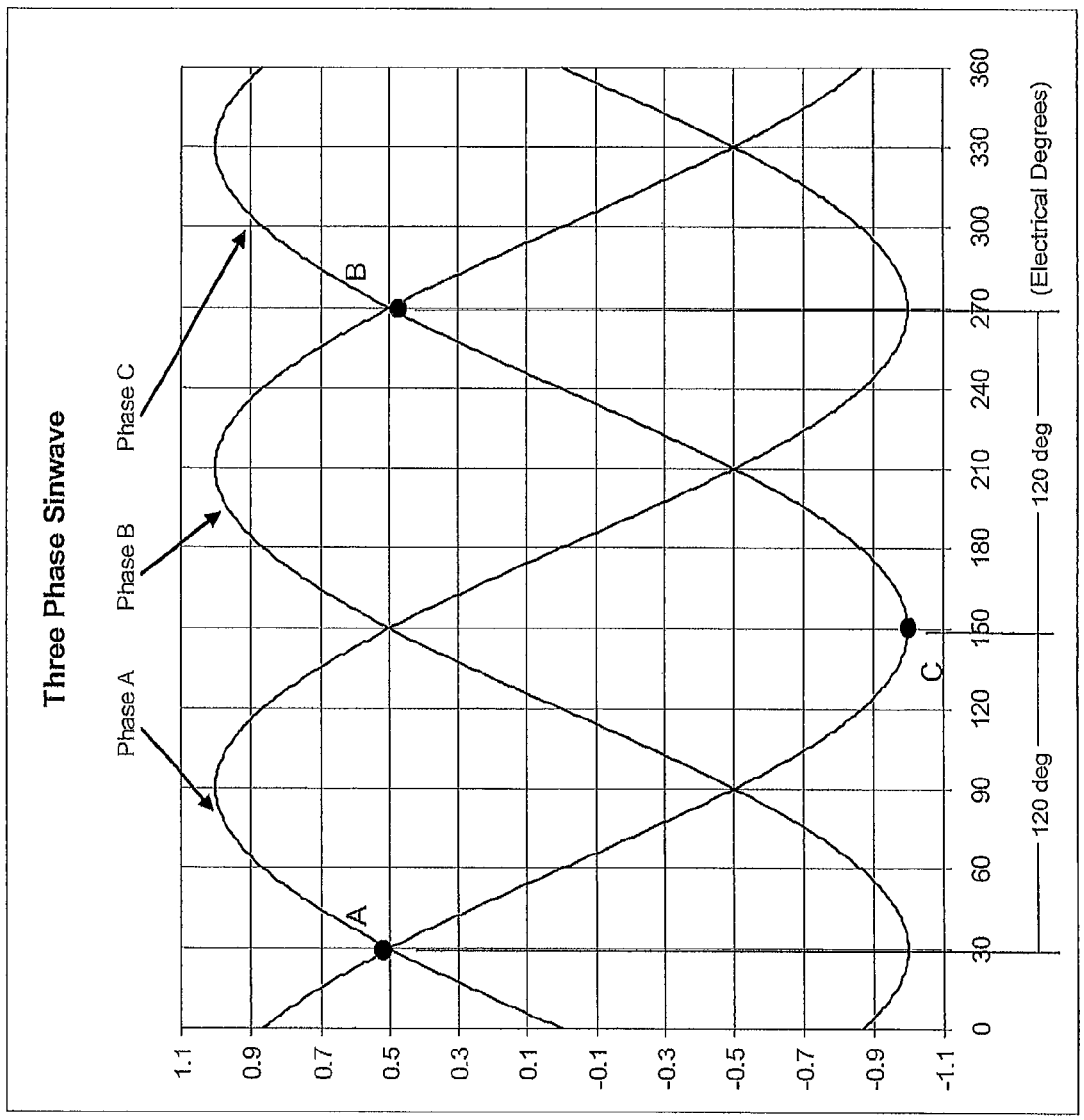
FIG. 3 is an example graph showing a three phase sine wave in electrical degrees for an arbitrary frequency.

However, complex number math is not a simple task to implement in a DSP. Thus, in accordance with an aspect of the present disclosure, another simpler way is used to get the negative sequence. $I_{a2}{}^{\bullet}$ is regarded as one-third the sum of $I_a{}^{\bullet}$, 240 deg. delay of $I_b{}^{\bullet}$ and 120 deg. delay of $I_c{}^{\bullet}$, as illustrated in FIG. 3. In FIG. 3, point $I_B$ is 240 deg. delay of point $I_A$ and point $I_C$ is 120 deg. delay of point $I_A$. The negative sequence at point $I_A$ is the sum of these three points ($I_A+I_B+I_C$).

By using this algorithm, the negative sequence of three-phase input current is easily obtained by adding points $I_A$, $I_B$, $I_C$ together. Likewise, the negative sequence of three-phase voltage can be calculated in the same way. In an illustrative implementation in a DSP (such as DSP 142 shown in phantom in FIG. 1 may be part of control module 132), three arrays, each with specified number elements, were created to store the data from three phase current (designated phase A, phase B and phase C). (It should be understood that showing DSP 142 in FIG. 1 does not mean that DSP 142 configured to implement the methodologies of the present disclosure is part of the prior art.) It should be understood that the specified number elements in the data arrays are a matter of designer's choice. For this implementation the number of elements for each array was picked to be 46, where 45 elements hold the interpolated sampled data and the 46th element holds the previous sample for the next interpolation. The sampling rate is chosen as 45 samples per line cycle based on a fixed 60 Hz frequency. These arrays may be referred to herein as the Phase A sample data array for phase A current, Phase B sample data array for phase B current, and Phase C sample data array for phase C current. Since there are 45 samples per line cycle, phase A current data is continuously taken and stored in the Phase A sample data, taking and storing Phase C current data in the Phase C sample data array starts on the 15th sample time (sample time beginning when the first sample in a cycle of Phase A current is taken), and taking and storing Phase B current data in the Phase B sample data array starts on the 30th sample time (sample time beginning when the first sample in a cycle of Phase A current is taken). With 45 samples per cycle, a 15 sample time delay is 120 degrees delayed from when the first sample in a cycle of Phase A current is taken and 30 sample time delay is 240 degrees delayed from when the first sample in a cycle of Phase A current is taken for a fixed 60 Hz frequency. It should be understood that it is a matter of designer's choice that the sampling rate can be chosen to be at a different fixed rate based on some nominal frequency or the sampling rate can be varied based on measured frequency to fix the number of samples per cycle for any frequency.

It should be understood that the samples for the phase C current may be calculated as described above as opposed to being measured samples. If a current transformer is provided on the phase c leg, then the samples of the phase c current can be measured using the third current transformer.

It should also be understood that the $46^{th}$ element in the array, which may be location 0, stores the last sample from the prior cycle and is illustratively used for linear interpolation as described below. Alternatively, another variable can be used to store this sample. It should be understood that it is a designer's choice as to whether to store the last sample from the prior cycle in a location of the current array, or elsewhere.

By triggering arrays in this sequence, the data in those arrays are 120 degrees apart from each other (assuming that the actual input frequency matches nominal frequency). When they are added together, the result is the negative sequence component of three-phase input current. The absolute value of the negative sequence calculation is filtered and then the filtered value is compared with a threshold to determine the status of fuses. The threshold may illustratively be heuristically determined or determined analytically. It should be understood that the determination of the threshold should account for errors in the analog measurement system and errors in a sampled data system.

The rate of sampling may illustratively be fixed at $$\frac{1}{50*45}$$

for a 50 Hz UPS or $$\frac{1}{60*45}$$

for a 60 Hz UPS. However, the actual input frequency may deviate from 50 Hz or 60 Hz. In an aspect, the blown fuse detection methodology includes methodology adaptive to the frequency of the input power provided to the UPS, such as UPS system 100. In an illustrative embodiment, a counter counts the pulses of a clock during a period between two zero crossing points of the input voltage waveform, illustratively derived from the voltage measurements across circuit breaker 112. By using that counter as a period calculator, the actual input frequency can be determined and a proper gate value set to trigger three arrays to store samples at right time. But the values stored in the Phase A, Phase B and Phase C sample data arrays may not be exactly 120 deg. apart from each other since the frequency may not be exactly 50 Hz or 60 Hz. Thus, in an aspect, linear interpolation is used to get the correct values for phase A, phase B at 240 degrees delayed phase A, and phase C at 120 deg. delayed Phase A.

Since there are three arrays with 45 elements per cycle, the minimum frequency that can be calculated is:

$$\frac{1}{\left(45 \text{ elements} * \frac{3}{2}\right) \text{samples/cycle} * \frac{1}{60 \text{ Hz} * 45 \text{ samples/cycle}}} = 40 \text{ Hz}.$$

or $$\frac{1}{\left(45 \text{ elements} * \frac{3}{2}\right) \text{samples/cycle} * \frac{1}{50 \text{ Hz} * 45 \text{ samples/cycle}}} = 33.33 \text{ Hz}.$$

Likewise, if the frequency is 80 Hz for 60 Hz unit or 70 Hz for 50 Hz unit, then:

$$\frac{60\ Hz}{80\ Hz} * 45 = 33.75\ samples/cycle$$

or $$\frac{50\ Hz}{70\ Hz} * 45 = 32.14\ samples/cycle$$

is also within the range of the calculation. Thus, this algorithm is adaptive to at least ±20 Hz of nominal frequency.

For a 60 Hz unit (nominal input frequency of 60 Hz) with a fixed sampling rate of $$\frac{1}{60*45},$$

every 15th sample=120 degrees when the actual frequency of the input waveform matches the nominal frequency, as shown in FIG. 4. For other frequencies, that is, when the actual frequency of the input waveform deviates from the nominal frequency of 60 Hz, every 15$^{th}$ sample is not exactly 120 degrees as shown in FIG. 5. As can be seen from FIG. 5, for a 62 Hz sine waveform, samples 5, 20 and 35 are no longer 120 degrees apart from each other, points A, B, C are still 120 degrees apart but the actual point has a whole sample part and a fractional sample part. Point C is actually at 19.52 sample time, while point B is at 34.03 sample time. If just the whole sampled data is used for the 20th sample (Phase C) and 35th sample (Phase B), the negative sequence calculation won't be as accurate. Thus, in an aspect, linear interpolation is used to calculate $I_a$, $I_b$, $I_c$ and make sure the data in three buffers are 120 degrees apart from each other.

For instance, a 60 Hz waveform, to get $I_c$ which is 120 degrees apart from the $I_a$ sample, the linear interpolation function is $$y_m = y_{14} + \frac{y_{15} - y_{14}}{x_{15} - x_{14}} * (x_m - x_{14})$$

Where $y_m$ is the 120 degrees $I_c$ value from the first $I_a$ sample; $x_m$ is the time when $y_m$ sample is taken, i.e. 120 degrees $I_c$ value apart from first $I_a$ sample. $y_{14}$ and $y_{15}$ are the 14 and 15 sample data of $I_c$ current; $x_{14}$ and $x_{15}$ are the time when the 14 and 15 $I_c$ samples are taken. The above equation can be written into a general format as follows to get 120 degrees apart Ic data, where y(k) is the latest sampled datum, y(k−1) is the previous sampled datum stored in array[0], y'(k) is the needed 120 degrees apart datum, N is the number of sample at time of sampling y(k−1), such as N=14 for 60 Hz waveform, Ts is the sampling period and T is the actual period of input waveform $I_c$.

$$y'(k) = y(k-1) + \frac{y(k) - y(k-1)}{Ts} * \left(\frac{1}{3} * T - N * Ts\right)$$

Where $$N = \text{floor}\left(\frac{T}{3*Ts}\right),$$

floor means round towards minus infinity.

For 240 degrees apart datum of $I_b$, the above equation can be written into the following format, where N is the same number in the previous equation, Ts is the sampling period and T is the actual period of input waveform $I_b$.

$$y'(k) = y(k-1) + \frac{y(k) - y(k-1)}{Ts} * \left(\frac{2}{3} * T - (2*N+1) * Ts\right)$$

Where $$N = \text{floor}\left(\frac{T}{3*Ts}\right),$$

floor means round towards minus infinity.

Illustratively, Phase B and Phase C Array[0] locations are used to store y(k−1) for calculation convenience. But it should be understood that it's a designer's choice whether to use the Array[0] location, as discussed above. Phase B and Phase C Array[1] to Array[45] locations are illustratively used to store y(k), the interpolation results of 240 degrees (from Phase A) apart data for Phase B and 120 degrees apart (from Phase A) data for Phase C.

FIG. 6 is a flow chart showing the adaptive blown fuse detection methodology in accordance with above described aspects and FIG. 7 is a flow chart showing the adaptive to frequency methodology in accordance with above described aspects. The adaptive blown fuse detection methodology and adaptive to frequency methodology may illustratively be implemented in a UPS system, such as UPS system 100, by programming control module 132 with software that implements the fuse detection methodology and adaptive to frequency aspects.

An alternative to using linear interpolation when the frequency changes is to varying the sampling frequency such that the sampling frequency is always an integer multiple of the actual frequency. For example, if the measured frequency is 60.1 Hz, instead of 60.0 Hz, then the sampling rate is changed to 2704.5 Hz such that there are exactly 45 samples per line cycle. If the sampling frequency is varied according to the input waveform frequency in order to have fixed number of samples per line cycle for various frequency inputs, for example, 45 samples per line cycle, the algorithm will be simplified. Because the number of samples per line cycle is always fixed at 45, for example, 120 degrees phase delay datum will be equal to 15 samples delay time period and 240 degrees phase delay datum will be equal to 30 samples delay time period, as shown in FIG. 4. In another word, in this alternative, linear interpolation won't be needed to calculate the corresponding 120 or 240 degrees data.

If the measured input current frequency is $f_{in}$, the sampling frequency can be calculated as follows:

$$f_s = f_{in} * N_s$$

Where, $f_{in}$ is the input waveform frequency, $f_s$ is the sampling frequency and $N_s$ is the number of samples per line cycle, i.e. 45.

FIG. 8 is a flow chart showing the alternate approach to the linear interpolation methodology in accordance with above described aspects. The frequency $f_{in}$ of Phase A, B, C input current will be measured first and then the above equation $f_s = f_{in} * N_s$ used to calculate the corresponding sampling frequency $f_s$. The sampling frequency will be changed to the calculated sampling frequency and the input component, such as input current, will be sampled at that frequency. By way of example and not of limitation, control module 132 may include an analog-to-digital converter (A/D) (not shown) and A/D timer (not shown) and the control module calculates a the sampling frequency by calculating a time period for the A/D timer sets the A/D timer to the calculated time period. The Phase B sample data array will start to store data at 30 samples later after sample data Phase A sample data array started to store data and Phase C sample data array will start to store data at 15 samples later after Phase A sample data array started to store data.

Figure 1:
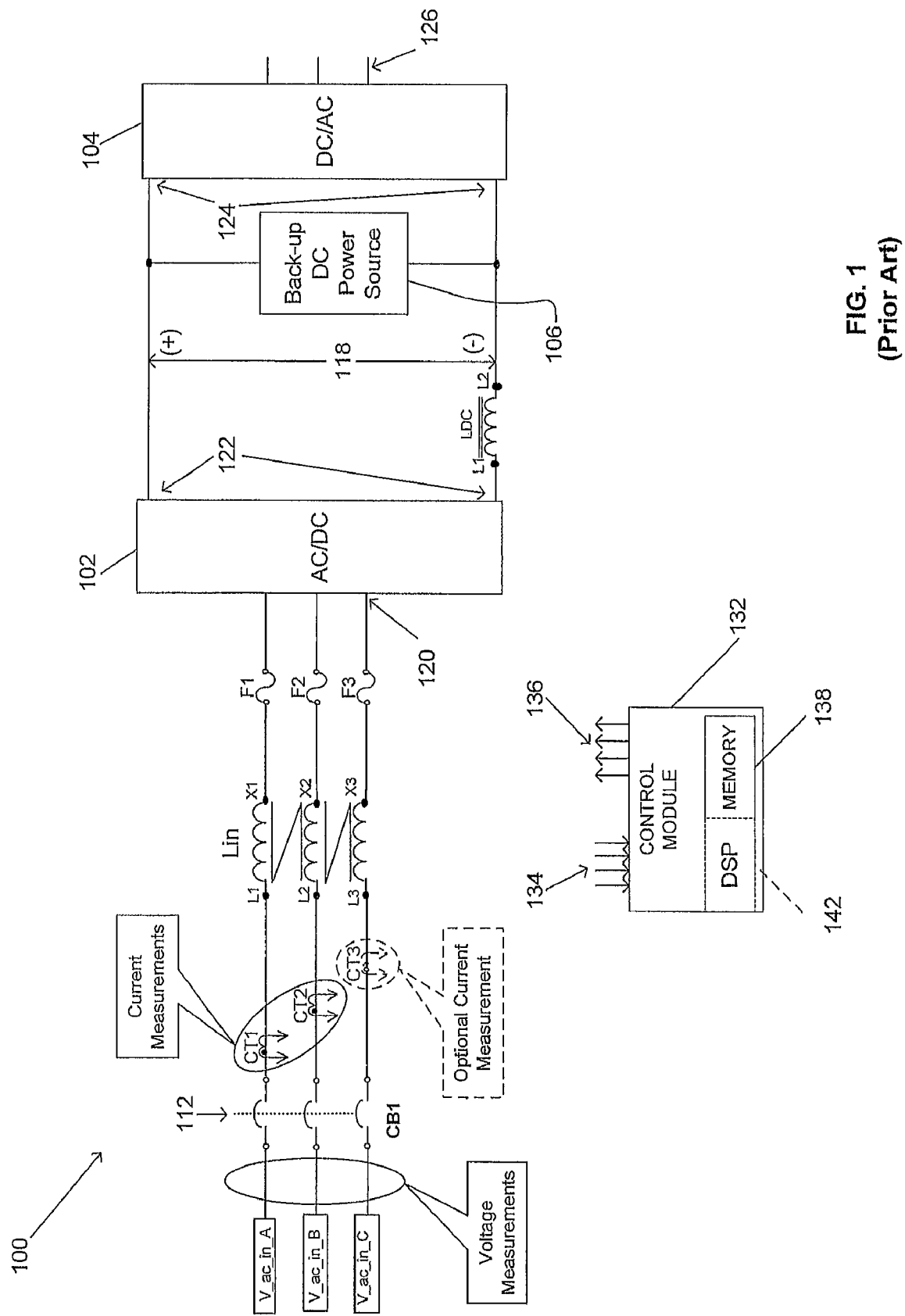
FIG. 1 is a simplified schematic of a prior art UPS system.
Figure 2:
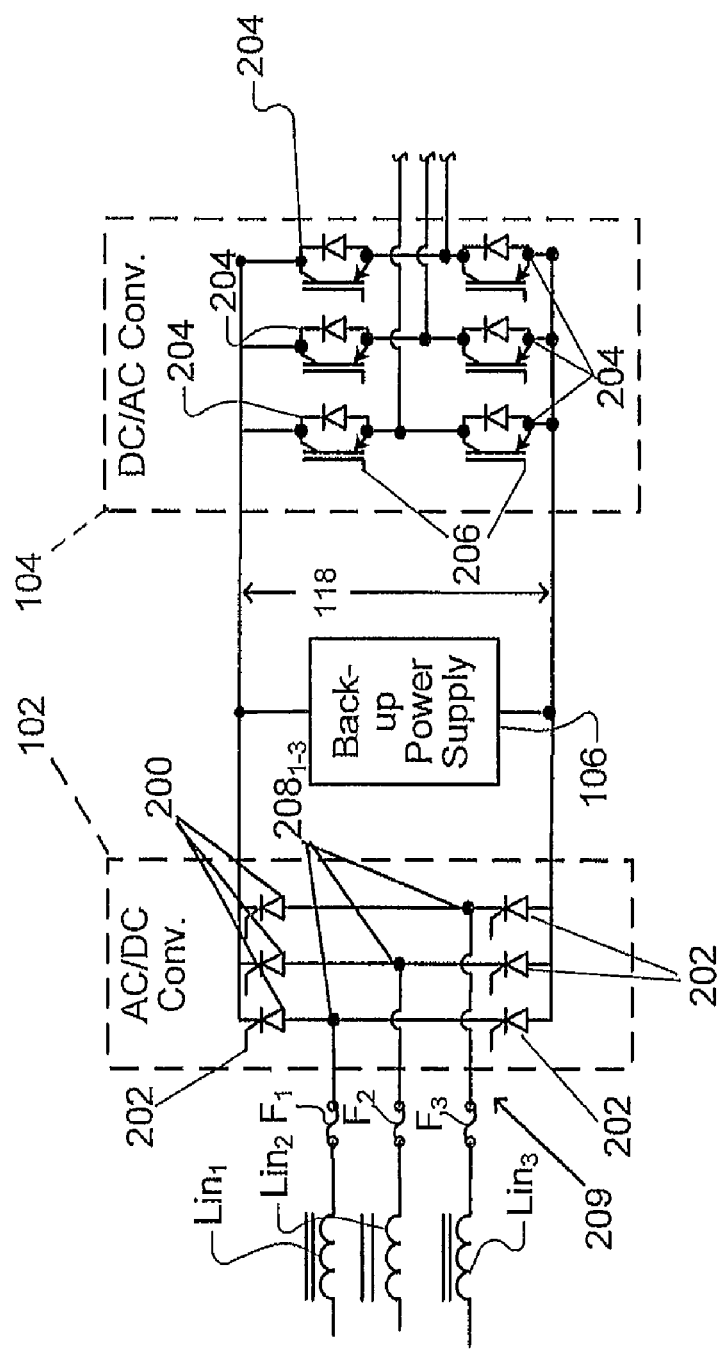
FIG. 2 is a simplified schematic showing the AC/DC converter and DC/AC converter of the UPS system of FIG. 1 in more detail.

With reference to FIGS. 1 and 6, at 600 control module 132 samples the input current on phase A and phase B of the input power by taking current measurements of the current on phases A and B with $CT_1$ and $CT_2$. At 602, control module 132 generates the Phase C sample data using the Phase A and Phase B sample data wherein the Phase C value for each sample point is determined by the equation $i_c = -i_a - i_b$, where $i_a$ is the Phase A current and $i_b$ is the Phase B current. Control module 132 generates arrays of Phase A, Phase B and Phase C sample data, illustratively for one cycle (three hundred and sixty degrees) of the input current waveform being sampled, and stores these arrays in a memory 138. Memory 138 may illustratively be part of control module 132 (as shown FIG. 1), or it may be separate. As discussed above, these arrays may include forty-six elements or samples, forty-five samples evenly spaced over the input power line cycle with the forty-sixth sample being the last sample of the previous cycle. It should be understood that these arrays can have more or less than forty-six elements. At 604, the arrays of Phase A, Phase B and Phase C samples are processed through the optional adaptive to frequency block (described above and as described below) to generate arrays of Phase A, Phase B and Phase C sample data corrected for any variations in the frequency of the input power from nominal. Control module 132 stores these frequency corrected arrays in memory 138.

At 606, control module 132 determines the negative sequence of the Phase A, Phase B and Phase C input components. It does so by taking one third the sum of point $I_a$, 240 degree delay of point $I_b$ and 120 degree delay of point $I_c$ where $I_a$ is a sample point in the Phase A data array, 240 degree delay of point $I_b$ is a point in the Phase B data array at a point in the line cycle that is 240 degrees delayed from the point in the line cycle at which point $I_a$ was taken, and 120 degree delay of point $I_c$ is a sample in the Phase C data array at a point in the line cycle 120 degrees delayed from the point in the line cycle at which point $I_a$ was taken. All the points in the Phase A, Phase B and Phase C data arrays are summed in this manner the results of the summation for each point summed, which results in the negative sequence of the three phase input current. As discussed above, the negative sequence of the three phase input voltage can be determined in similar fashion, but with the Phase A, Phase B and Phase C data arrays generated by using the voltage measurements taken by control module 132 at the three poles of circuit breaker 112.

At 608 control module 132 takes the absolute value of the negative sequence of the input component and filters it at 610 by taking determining the RMS value of the negative sequence. At 612, the RMS value of the negative sequence is then compared against a threshold to determine if any of rectifier fuses $F_{1-3}$ are blown. By way of example and not of limitation, if UPS system 100 is a 250 KVA, 480V, 60 Hz unit, the threshold may be 50A.

If control module 132 determines that any of rectifier fuses $F_{1-3}$ are blown, it takes corrective action at 614. This corrective action may include sounding or displaying an alarm to alert a user that a rectifier fuse $F_{1-3}$ is blown.

With reference to FIG. 7, an illustrative embodiment of the adaptive to frequency methodology is described. At 700 the Phase A data is continuously sampled and stored in the Phase A sample data array. At 702, the control module 132 determines the actual input frequency of the input waveform, such as input current, as described above. At 704, control module 132 calculates the approximate time it needs to wait for 120 deg and 240 deg and determines at which sample time it should start to store data, such as sample 15. Based on these results, control module 132 starts a timer and triggers the gate at the corresponding sample time to begin storing the samples in Phase B and Phase C sample data arrays. In another word, at 704, control module 132 waits the requisite delay periods before beginning storing at 708 the Phase B current data in the Phase B sample data array and at 710 storing the Phase C current data in the Phase C sample data array. At 712, control module 132 adjusts the data stored in the Phase B sample data array by linear interpolation as discussed above to further compensate for any deviation in actual frequency from measured frequency and at 716 stores the adjusted sampled data in the Phase B sample data array. At 714, control module 132 adjusts the data stored in the Phase C sampled data array by linear interpolation as discussed above to further compensate for any deviation in actual frequency from measured frequency and at 718 stores the adjusted Phase C sample data in the Phase C sample data array. It should be understood that the linear interpolation can occur for a sample datum before it is stored in its respective sample data array, or after. If after, the sample data array in which the adjusted sample data is stored may be a separate data array. If so, there may illustratively be an unadjusted Phase B sample data array, adjusted Phase B sample data array, unadjusted Phase C sample data array, and adjusted Phase C sample data array. If before, there may illustratively only be adjusted Phase B sample data array and adjusted Phase C sample data array. The adjusted data arrays are then used in determining the negative sequence of the input current as discussed above.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

What is claimed is:

1. A three-phase power supply system, comprising:
an AC/DC converter having a three phase power input coupled through three fuses to three legs of three phase AC power (Phase A, Phase B, Phase C), an output coupled to a DC bus, and a control input coupled to an output of a control module;
the three phase input power having input components including current and voltage, the control module generating three arrays of data for one of the input components, one array for each of the three phases of the three phase input power including a Phase A sample data array for a Phase A component of the input component, a Phase B sample data array for a Phase B component of the input component, and a Phase C sample data array for a Phase C component of the input component;
the control module generating a negative sequence of the input component for which it generated the data arrays by taking one third of the sum of point $I_a$, point $I_b$. and point $I_c$, where point $I_a$ is a datum in the Phase A data array when the negative sequence is being determined, point $I_b$. is a datum point in the line cycle that is 240 degrees delayed from the point $I_a$, and point $I_c$ is a datum point in the line cycle that is 120 degrees delayed from the point $I_a$, and the control module determining that an input fuse is blown if the value of the negative sequence of the input component exceeds a threshold.

2. The apparatus of claim 1 wherein the input component for which the control module generates the negative sequence is input voltage.

3. The apparatus of claim 1 wherein the input component for which the control module determines the negative sequence is input current.

4. The apparatus of claim 1 wherein the control module generates the absolute value of the negative sequence of the input component, filters the absolute value of the negative sequence of the input component to generate an RMS value of the negative sequence of the input component; and to determine that the value of the negative sequence of the input component exceeds the threshold determines if the RMS value of the negative sequence of the input component exceeds the threshold.

5. The apparatus of claim 1 wherein the control module control module samples one or more of the of the Phase A, Phase B and Phase C input components to generate the Phase A, Phase B and Phase C sample data arrays, the control module sampling those of the Phase A, Phase B and Phase C input components that it samples at a fixed sampling rate, measures an actual frequency of a line voltage of the input power and adjusts when it begins storing samples of the Phase B and Phase C input components in the Phase B and Phase C sample data arrays based on any deviation of the actual frequency from a nominal frequency of the line voltage.

6. The apparatus of claim 5 wherein if the samples of the Phase A, Phase B and Phase C input components are not 120 degrees apart from each other, the control module adjusts the samples for the Phase B and Phase C data sample arrays using linear interpolation so that the samples stored in the Phase A, Phase B and Phase C data samples are 120 degrees apart from each other.

7. The apparatus of claim 1 wherein the control module determines an actual frequency of the line voltage and adjusts a sampling rate at which it samples the input component from a nominal sampling rate based on a nominal frequency of the line voltage in response to any deviation of the actual frequency of the line voltage from the nominal frequency so that the samples are the same degrees apart from each other as they would have been if the actual frequency was the same as the nominal frequency.

8. The apparatus of claim 1 wherein:
the input component for which the control module determines the negative sequence is input current;
the apparatus including current transformers on only two of the three legs of the three phase input power coupled, the current transformers coupled to inputs of the control module;
the control module sampling via the current transformers input current on the two legs having the current transformers and generating the array of Phase A sample data for one cycle of the input current on one of the legs having one of the current transformers and the array of Phase B sample data for one cycle of the input current on the leg having the other current transformer; and
the control module generating an array of Phase C sample data for input current on the leg not having the second current transformers from the Phase A sample data and Phase B sample data by determining each sample for the Phase C sample data array by the equation $i_a+i_b+i_c=0$ where for each sample point in the line cycle $i_a$ is a sample of the Phase A current taken at that sampling point and $i_b$ is a sample in the Phase B current taken at that sampling point.

9. The apparatus of claim 6 wherein:
the input component for which the control module determines the negative sequence is input current;
the apparatus including current transformers on only two of the three legs of the three phase input power coupled, the current transformers coupled to inputs of the control module;
the control module sampling via the current transformers input current on the two legs having the current transformers and generating the array of Phase A sample data for one cycle of the input current on one of the legs having one of the current transformers and the array of Phase B sample data for one cycle of the input current on the leg having the other current transformer; and
the control module generating an array of Phase C sample data for input current on the leg not having the second current transformers from the Phase A sample data and Phase B sample data by determining each sample for the Phase C sample data array by the equation $i_a+i_b+i_c=0$ where for each sample point in the line cycle $i_a$ is a sample of the Phase A current taken at that sampling point and $i_b$ is a sample in the Phase B current taken at that sampling point.

10. The apparatus of claim 1 wherein the control module includes a digital signal processor that generates the negative sequence of the input component.

11. The apparatus of claim 1 wherein the power supply system is an uninterruptible power supply system having a DC/AC converter, the DC/AC converter having a power input coupled to the DC bus, a power output coupled to a power output of the uninterruptible power supply system and a control input coupled to an output of the control module, the power supply system further including a back-up DC power source coupled to the DC bus.

12. The apparatus of claim 1 wherein the power supply system is an power conditioning system having a DC/AC converter, the DC/AC converter having a power input coupled to the DC bus, a power output coupled to a power output of the uninterruptible power supply system and a control input coupled to an output of the control module.

13. The apparatus of claim 1 wherein the power supply system has a DC/DC converter, the DC/DC converter having a power input coupled to the DC bus, a power output coupled to a power output of the uninterruptible power supply system and a control input coupled to an output of the control module.

14. The apparatus of claim 13 where the power supply system is an uninterruptible power supply system having a back-up DC power source coupled to the DC bus.

15. The apparatus of claim 1 wherein the power supply system has an output coupled directly to the DC bus.

16. In a three phase power supply system having an AC/DC converter, the AC/DC converter having a power input coupled through input fuses to three phase AC power and an output coupled to the DC bus, the three phase input power having input components including current and voltage, a method of determining if any of the input fuses are blown, comprising:
generating with a control module of the uninterruptible power supply system three arrays of data for one of the input components for each of the three phases of the three phase input power including a Phase A data array, a Phase B data array and a Phase C data array and storing the three arrays of data in a memory;

generating with the control module a negative sequence of the input component for which it generates the data arrays by determining the negative sequence at current sample time by taking one third of the sum of point $I_a$, point $I_b$ and point $I_b$, where point $I_a$ is a datum in the Phase A data array when the negative sequence is being determined, point $I_b$ is a datum point in the line cycle that is 240 degrees delayed from the point $I_a$, and point $I_c$ is a datum point in the line cycle that is 120 degrees delayed from the point $I_a$, and determining with the control module that at least one of the input fuses is blown if the value of the negative sequence exceeds a threshold.

17. The method of claim 16 wherein generating with the control module a negative sequence of the input component includes generating with the control module a negative sequence of input voltage.

18. The method of claim 16 wherein generating with the control module a negative sequence of the input component includes generating with the control module a negative sequence of input current.

19. The method of claim 16 including generating with the control module an absolute value of the negative sequence of the input component, filtering with the control module the absolute value of the negative sequence to generate an RMS value of the negative sequence of the input component, and determining with the control module that at least one of the input fuses is blown if the value of the negative sequence exceeds a threshold includes doing so when the RMS value of the negative sequence of the input component exceeds the threshold.

20. The method of claim 16 including sampling with the control module one or more of the Phase A, Phase B and Phase C input components at a fixed sampling rate to generate the Phase A, Phase B and Phase C sample data array, measuring an actual frequency of a line voltage of the input power and adjusting when the control module begins storing samples of the Phase A and Phase C input components in the Phase B and Phase C sample data arrays based on any deviation of the actual frequency from a nominal frequency of the line voltage.

21. The method of claim 19 including adjusting by linear interpolation the samples for the Phase B and Phase C data sample arrays so that the Phase A, Phase B and Phase C samples are 120 degrees apart from each other if the samples of the Phase A, Phase B and Phase C input components are not 120 degrees apart from each other.

22. The method of claim 17 wherein the control module has a sampling rate at which it samples the input component, the method including determining an actual frequency of the line voltage and adjusting the sampling rate from a nominal sampling rate based on a nominal frequency of the line voltage in response to any deviation of the actual frequency of the line voltage from the nominal frequency so that the samples are the same degrees apart from each other as they would have been if the actual frequency was the same as the nominal frequency.

23. The method of claim 16 wherein the apparatus has current transformers on only two of the three legs of the three phase input power coupled to inputs of the control module, the method further including:
generating with the control module a negative sequence of the input component includes generating with the control module a negative sequence of input current;
sampling via the transformers input current on the two legs having the current transformers and generating the array of Phase A sample data for one cycle of the input current on one of the legs having one of the current transformers and the array of Phase B sample data for one cycle of the input current on the leg having the other current transformer and generating an array of Phase C sample data for input current on the leg not having the current transformers from the Phase A sample data and the Phase C sample data by determining each sample for he Phase C sample data array by the by the equation $i_a+i_b+i_c=0$ where for each sample point in the line cycle $i_a$ is a sample of the Phase A current taken at that sampling point and $i_b$ is a sample in the Phase B current taken at that sampling point.

24. The method of claim 21 wherein the apparatus has current transformers on only two of the three legs of the three phase input power coupled to inputs of the control module, the method further including:
generating with the control module a negative sequence of the input component includes generating with the control module a negative sequence of input current;
sampling via the current transformers input current on the two legs having the first and second current transformers and generating the array of Phase A sample data for one cycle of the input current on one of the legs one of the current transformers and the array of Phase B sample data for one cycle of the input current on the leg having the other current transformer and generating an array of Phase C sample data for input current on the leg not having one of the current transformers from the Phase A sample data and the Phase C sample data by determining each sample for he Phase C sample data array by the by the equation $i_a+i_b+i_c=0$ where for each sample point in the line cycle $i_a$ is a sample of the Phase A current taken at that sampling point and $i_b$ is a sample in the Phase B current taken at that sampling point.

25. The method of claim 16 wherein the control module includes a digital signal processor and generating the negative sequence with the control module includes generating the negative sequence with the digital signal processor of the control module.

* * * * *

UNITED STATES PATENT AND TRADEMARK OFFICE
CERTIFICATE OF CORRECTION

PATENT NO.        : 8,035,944 B2                               Page 1 of 1
APPLICATION NO.   : 12/371644
DATED             : October 11, 2011
INVENTOR(S)       : Xian Chen et al.

It is certified that error appears in the above-identified patent and that said Letters Patent is hereby corrected as shown below:

In the claims

Column 15,
Line 5, claim 16, "and point "$I_b$," should be --and point $I_c$--.

Signed and Sealed this
Third Day of May, 2016

Michelle K. Lee
*Director of the United States Patent and Trademark Office*